United States Patent
Tsuchiya et al.

(10) Patent No.: US 6,618,272 B2
(45) Date of Patent: Sep. 9, 2003

(54) ELECTRIC COMPONENT CONNECTING STRUCTURE

(75) Inventors: Takahiro Tsuchiya, Tokyo (JP); Morio Sugata, Tokyo (JP); Akihiro Hashimoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/983,165

(22) Filed: Oct. 23, 2001

(65) Prior Publication Data

US 2002/0048160 A1 Apr. 25, 2002

(30) Foreign Application Priority Data

Oct. 24, 2000 (JP) ......................................... 2000-323706

(51) Int. Cl.[7] ........................... H01R 9/00; H01R 12/06; H05K 7/02; H05K 1/18
(52) U.S. Cl. ........................ 361/823; 361/760; 361/807; 174/260; 439/76.2
(58) Field of Search ................................. 361/823, 760, 361/773, 774, 803, 611, 819, 788; 174/68.2, 726, 716, 88 B, 70 B, 99 B, 129 B, 133 B, 250, 260, 263, 772; 439/76.2

(56) References Cited

U.S. PATENT DOCUMENTS

| | | | | |
|---|---|---|---|---|
| 3,013,188 A | * | 12/1961 | Kohler | 317/101 |
| 4,088,828 A | * | 5/1978 | Yamamoto et al. | 174/68.5 |
| 4,869,675 A | * | 9/1989 | Ogawa | 439/76 |
| 5,699,235 A | * | 12/1997 | Tsurumiya et al. | 361/803 |
| 5,872,333 A | * | 2/1999 | Uezono et al. | 174/55 |
| 6,015,302 A | * | 1/2000 | Butts et al. | 439/76.2 |
| 6,194,656 B1 | * | 2/2001 | Kondo et al. | 174/52.1 |
| 6,264,510 B1 | * | 7/2001 | Onizuka et al. | 439/876 |
| 6,283,769 B1 | * | 9/2001 | Asao et al. | 439/76.2 |
| 6,372,998 B1 | * | 4/2002 | Suzuki et al. | 174/260 |

* cited by examiner

Primary Examiner—David Martin
Assistant Examiner—Dameon E. Levi
(74) Attorney, Agent, or Firm—Oblon, Spivak, McClelland, Maier & Neustadt, P.C.

(57) ABSTRACT

An electric component connecting structure including a resin case having a first surface and a second surface, at least one metal bus bar fixed on the first surface of the resin case and having at least one welding projection portion, and at least one electric component mounted on the second surface of the resin case and having at least one lead leg. The at least one lead leg is welded to the at least one welding projection portion of the at least one metal bus bar.

5 Claims, 4 Drawing Sheets

ELECTRIC COMPONENT CONNECTING STRUCTURE

BACKGROUND OF THE INVENTION

The present invention relates to an electric-component connecting structure for connecting electric components to bus bars and, more particularly, to the structure for securely fixing and connecting electric components to bus bars without the use of solder.

Conventionally, in order to structure an electric circuit by arranging electric components, it has been a general practice to use a substrate for connecting conductors to the electric components. Naturally, solder connection has been used in connection to the electric components.

However, in solder connection, there is a problem with solder-crack occurrence in the temperature impact test based on the user's specification. Meanwhile, in the recent environmental problems, there is an emphasized problem for establishing a Pb-free structure free of Pb use.

SUMMARY OF THE INVENTION

Accordingly, in order to solve such a problem, it is an object of the present invention to provide an electric-component connecting structure that is free from crack occurrence in the temperature impact test, higher in reliability than solder connection and of a Pb-free structure.

The outline of the present invention will be explained with FIG. 1. In FIG. 1, 1 is a resin case, 2 to 5 are bus bars, 6 to 10 are electric components, 11 is a hole, 21 is a projection and 61 is a lead leg.

The object of the invention can be achieved by the following structures (1) to (3).

(1) The electric component connecting structure includes: a resin case 1; a bus bar 2 to 5 made of metal fixed on the resin case; and a welding projection 21 formed in the bus bar 2 to 5, for connection to a lead leg 61 of an electric component 6 to 10, wherein electric connection is made between the electric component 6 to 10 and the bus bar 2 to 5 by welding the welding projection 21 with the lead leg 61 of the electric component.

(2) In the electric component connecting structure of the above (1), fixing part is formed on the resin case to position or temporarily fix the electric component.

(3) The electric component connecting structure includes: a resin substrate; a bus bar made of metal fixed on the resin case; and a welding projection formed in the bus bar, for connection to a lead leg of an electric component, wherein electric connection is made between the electric component and the bus bar by welding the welding projection with the lead leg of the electric component.

This provides the below operation effects.

(1) By providing a bus bar 2 to 5 made of metal fixed on a resin case 1, forming a welding projection 21 for welding to a lead leg 61 of each of a plurality of electric components 6 to 10 and welding the welding projection 21 to the electric-component lead leg 61, electric connection is made between the electric component 6 to 10 and the bus bar 2 to 5. Accordingly, it is possible to provide an electric component connecting structure which is free from crack occurrence in the connection even due to temperature impact test, free of Pb and higher in reliability than solder connection.

(2) Because the resin case is formed with fixing part to position or temporarily fix the electric component, it is possible, in advance of welding, to correctly position between the electric component and the welding projection. Thus, welding connection can be made with efficiency and correctness.

(3) By providing a bus bar made of metal fixed on a resin substrate, providing a plurality of welding projections for welding to lead legs of a plurality of electric components and welding the welding projection with the electric-component lead leg, electric connection is made between the electric component and the bus bar. Accordingly, it is possible to provide an electric component connecting structure which is free from crack occurrence in the connection even due to temperature impact test, free of Pb and higher in reliability than solder connection.

DETAILED DESCRIPTION OF THE PREFERRED EMBODIMENT

Figure 1A:
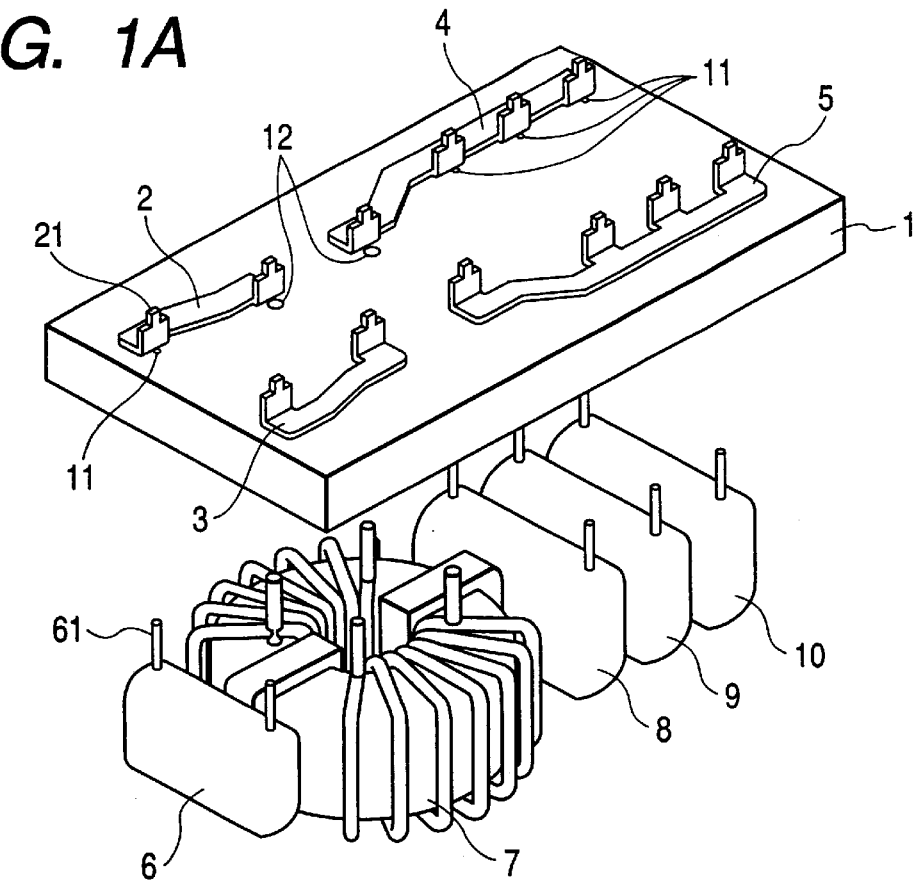
FIGS. 1A and 1B show perspective explanatory views of an electric component connecting structure of the present invention.
Figure 1B:
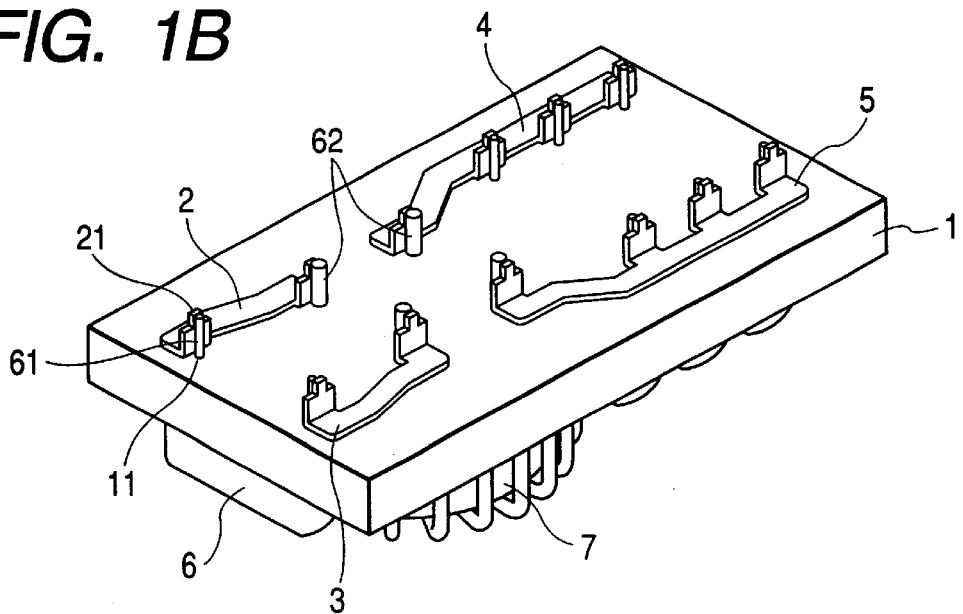
Figure 2:
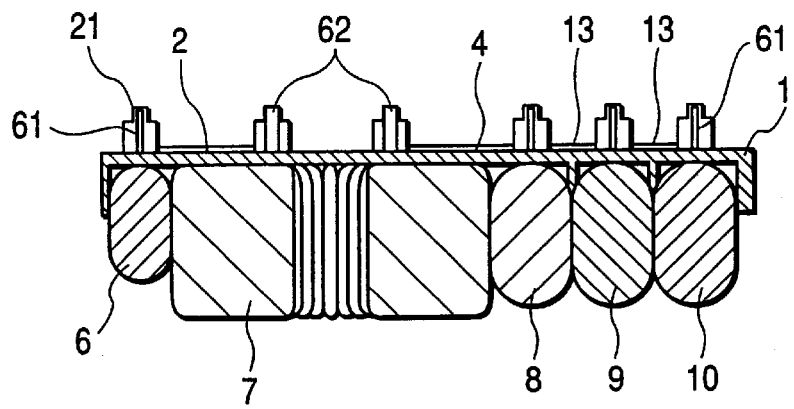
FIG. 2 shows an assembly sectional view of the electric component connecting structure of the invention.
Figure 3:
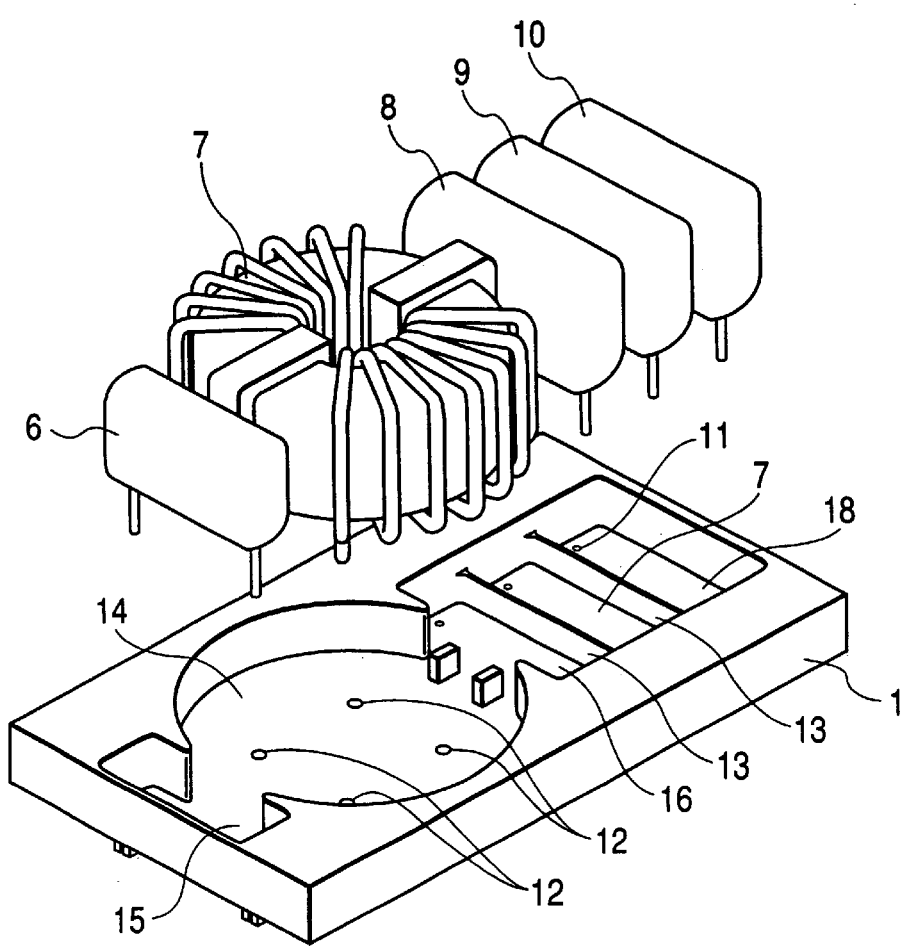
FIG. 3 shows an exploded perspective backside view of the electric component connecting structure of the invention.
Figure 4:
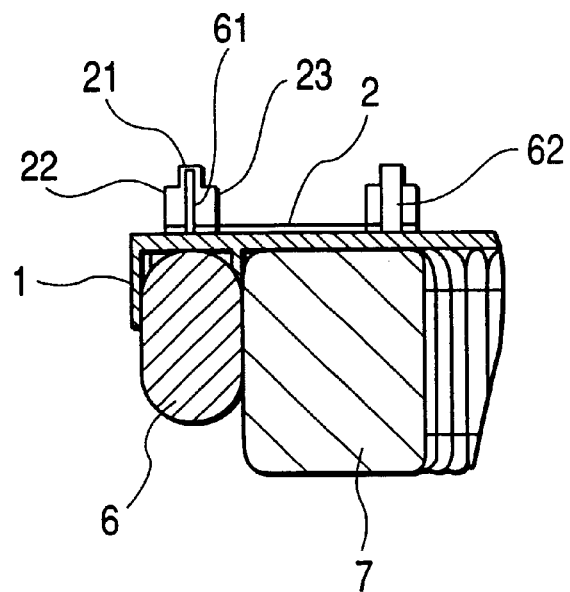
FIG. 4 shows a projection-periphery magnifying view of the electric component connecting structure of the invention.
Figure 5:
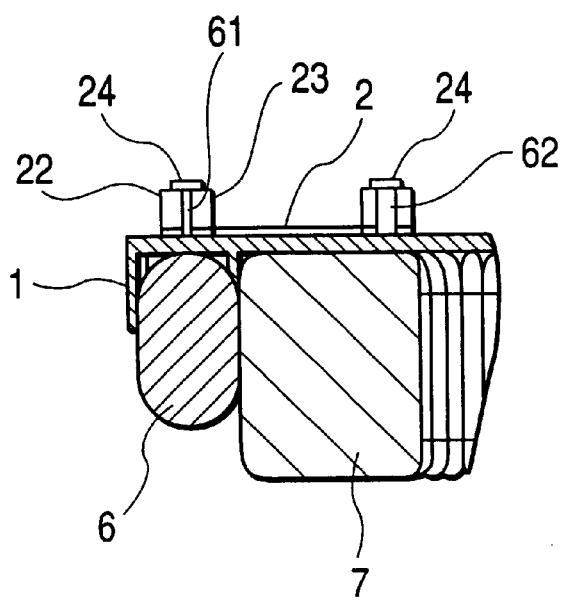
FIG. 5 shows a projection-periphery magnifying view, after welding, of the electric component connecting structure of the invention.

An embodiment of the resent invention will be explained with FIG. 1 to FIG. 5. FIGS. 1A and 1B are a perspective explanatory view of an electric component connecting structure of the present invention. FIG. 2 is an assembly sectional view of the electric component connecting structure of the invention. FIG. 3 is an exploded perspective backside view of the electric component connecting structure of the invention. FIG. 4 is a projection-periphery magnifying view of the electric component connecting structure of the invention. FIG. 5 is a projection-periphery magnifying view, after welding, of the electric component connecting structure of the invention.

In the figure, the same symbols show the same parts, wherein 1 is a resin case, 2 to 5 are bus bars, 6 to 10 are electric components, 11 and 12 are holes, 13 is a partition wall, 14 is a circular definition, 15 to 18 are rectangular definitions, 21 is a projection, 22 and 23 are shoulders, 24 is a ball, 61 is a lead leg of the electric component 6, 8 to 10, and 62 is a lead leg for the electric component 7.

The resin case 1 is to fixedly arrange the bus bars 2, 3, 4 therein, and made, for example, of glass epoxy resin. In the back surface of the resin case 1, partition walls 13, a circular definition 14, a rectangular definition 15 and the like are formed as shown in FIG. 3. In the circular definition 14, holes 12 greater than that for a hole 11 for the lead leg 61 of the other electric component 6, 8, 9 and 10, are provided for the lead leg 62 of the electric component 7 like a line filter. An electric component 6 is inserted in the rectangular definition 15 while an electric component 7 is inserted in the circular definition 14. Also, an electric component 8 is inserted in the rectangular definition 16, an electric component 9 is inserted in the rectangular definition 17, and an electric component 10 is inserted in the rectangular definition 18. These definitions firmly, temporarily fix the electric components and serve to position the electric components cooperatively with the holes 11, 12, thus allowing for efficient welding.

The bus bar 2 is provided to connect the electronic component or connect the electronic component to another circuit (not shown), and made of copper plate, brass or the like, for example. The bus bar 2 is assembled and fixed in the resin case 1 by the method of welding, adhesion, caulking, press-fitting, screwing, insert molding or the like. The bus bar 2 is also formed with a projection 21 for welding. The bus bars 3, 4 and 5 are similarly structured to the bus bar 2, and assembled and fixed in the resin case 1.

The electric component 6 is a component, e.g. a capacitor, to be electrically connected and fixed, by welding, to the bus bars 2 and 3. The electric component 7 is a component, e.g. a line filter, to be electrically connected and fixed, by welding, to the bus bars 2, 3, 4 and 5. Also, the electric components 8, 9 and 10 are components, e.g. capacitors, to be electrically connected and fixed, by welding, to the bus bars 4 and 5. These electric components 6 to 10 constitute, for example, a vehicular converter.

Explanation will be made on the connection and assembling with the resin case 1, the bus bars 2 to 5 and the electric components 6 to 10.

(1) As shown in FIG. 1, first the bus bars 2, 3, 4 and 5 are fixed and arranged in the resin case 1. At this time, in the resin case 1, holes 11 and 12 are provided in the vicinity of the projections 21 formed on the bus bars 2, 3, 4 and 5. Then, the electric component 7 is inserted in the circular definition 14 shown in FIG. 3, the electric component 6 is inserted in the rectangular definition 15, and the electric components 8, 9 and 10 are respectively inserted in the rectangular definitions 16, 17 and 18. Due to this, as shown in FIG. 1B the lead legs 61 and 62 of the electric components are juxtaposed to the projections 21 formed on the bus bars 2, 3, 4 and 5, thus placed in a state ready to arc-weld.

(2) In this state, arc welding is made for the projections 21 and the lead legs 61, 62 with using an arc-welder (not shown). By this arc welding, the projected lead legs 61 and 62 and the tip of the projections 21 shown in FIG. 4 are fused into ball forms as shown in FIG. 5, then the projections 21 and the lead legs 61 and 62 are welded. Thus, the electric components are securely connected electrically and mechanically to the bus bars.

In the meanwhile, because the projection 21 is in a convex form having shoulders 22 and 23, the fused balls 24 are stable in position without falling in a drop as shown as a post-welding state of FIG. 5. Thus, such a convex form is preferred.

Meanwhile, because solder connection requires increased time due to remaining heat, welding with an arc-welder requiring less time is more effective.

Because the resin case is formed with definitions by partition walls or the like and the components can be firmly inserted and temporarily fixed therein, welding operation can be effectively carried out.

Moreover, because the holes are formed in the vicinity of the projections, the electric components can be correctly positioned. Thus, welding operation can be effectively carried out.

In this manner, it is possible to provide an electric component connecting structure which is free from crack occurrence even in the temperature impact test and does not use Pb.

Figure 6:
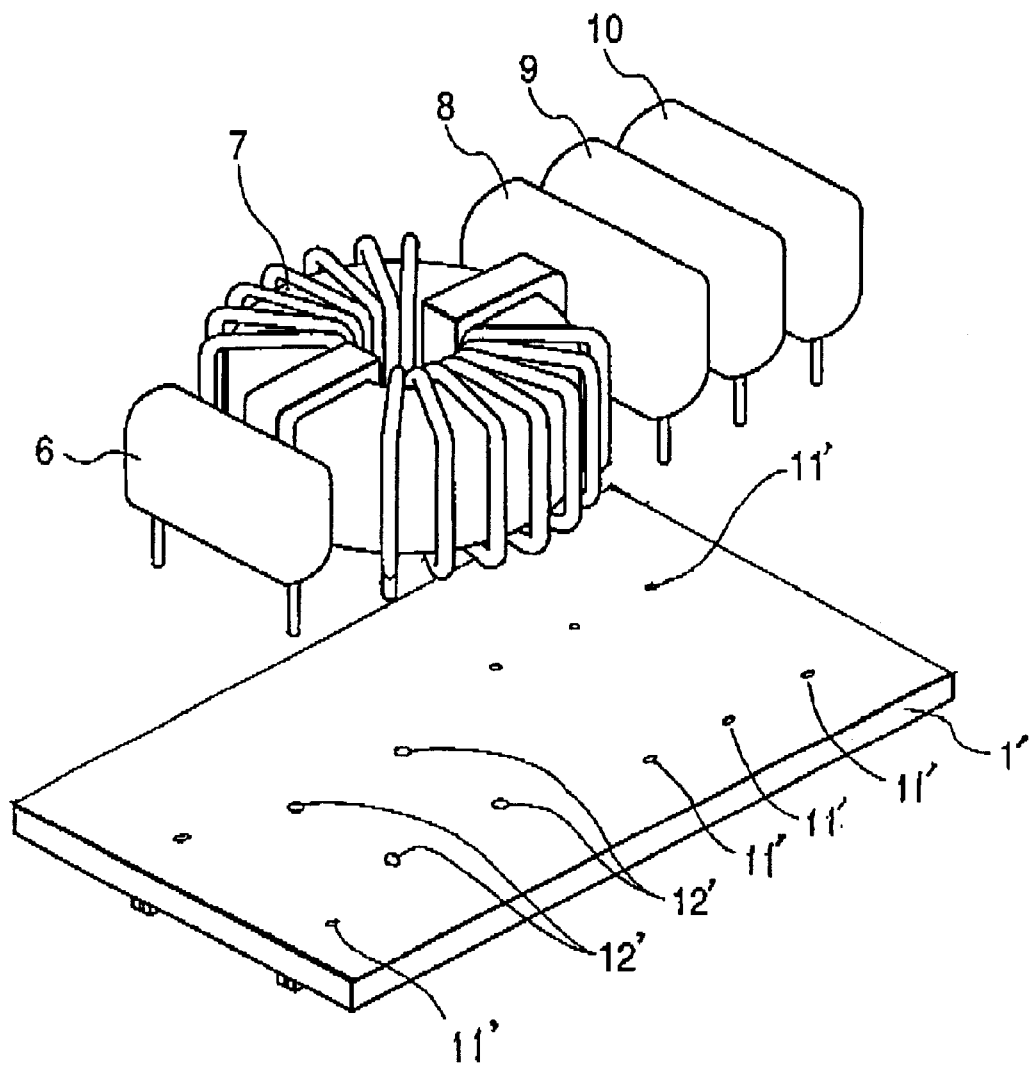
FIG. 6 is a perspective view of an electric component connecting structure according to another embodiment of the present invention.

Although the foregoing explanation explained the example using a resin case on which bus bars are provided, the invention is not limited to this, i.e. a resin substrate 1' may be used as shown in FIG. 6. In that case, although the positioning of electric components 6, 7, 8, 9, 10 is only with the holes 11', 12', positioning is correctly made which also makes welding operation effective.

The present invention can provides the following effects.

(1) Metal-make bus bars 2 to 5 are provided fixed on a resin case 1, welding projections 21 for welding to the lead legs 61 of a plurality of electric components 6 to 10 are formed in the bus bars 2 to 5 and the welding projections 21 are welded to the electric-component lead legs 61 thereby electrically connecting the electric components 6 to 10 to the bus bars 2 to 5, whereby it is possible to provide an electric component connecting structure that is free from crack occurrence even due to a temperature impact test, Pb-free and higher in reliability than solder.

(2) Because fixing part for positioning or temporarily fix the electric components is formed in the resin case, it is possible, in advance of welding, to correctly position between the electric components and the welding projections and carry out soldering and connection efficiently and correctly.

(3) Metal-make bus bars are provided fixed to a resin substrate, welding projections for welding to the lead legs of a plurality of electric components are formed in the bus bars and welding is made to the lead legs of electric components through the welding projections, whereby it is possible to provide an electric component connecting structure that is free from crack occurrence even due to a temperature impact test, Pb-free and higher in reliability than connection by soldering.

What is claimed is:

1. An electric component connecting structure comprising:
   a resin case having a first surface, a second surface, and at least one aperture;
   at least one metal bus bar fixed on the first surface of said resin case and having at least one welding projection portion; and
   at least one electric component mounted on the second surface of said resin case and having at least one lead leg, the at least one lead leg projecting through the at least one aperture and being juxtaposed to the at least one welding projection portion, the at least one lead leg being welded to the at least one welding projection portion of the at least one metal bus bar on the first surface.

2. The electric component connecting structure according to claim 1, wherein said resin case has at least one fixing section configured to receive and hold said at least one electric component.

3. An electric component connecting structure comprising:

a resin substrate having a first surface, a second surface, and at least one aperture;

at least one metal bus bar fixed on the first surface of said resin substrate and having at least one welding projection; and at least one electric component mounted on the second surface of said resin substrate and having at least one lead leg, the at least one lead leg projecting through the at least one aperture and being juxtaposed to the at least one welding projection portion, the at least one lead leg being welded to the at least one welding projection portion of the at least one metal bus bar on the first surface.

4. The electric component connecting structure according to claim 1, wherein said at least one welding projection has a convex form.

5. The electric component connecting structure according to claim 3, wherein said at least one welding projection has a convex form.

* * * * *